PRODUCTION OF CIRCUIT DEVICE

Original Filed Aug. 2, 1965

3 Sheets-Sheet 1

United States Patent Office 3,817,799
Patented June 18, 1974

3,817,799
PRODUCTION OF CIRCUIT DEVICE

Hans-Jurgen Schutze and Klaus Hennings, Ulm (Danube), Germany, assignors to Telefunken Patentverwertungs-gesellschaft G.m.b.H., Frankfurt am Main, Germany Original application Aug. 2, 1965, Ser. No. 476,536, now Patent No. 3,689,992. Divided and this application Feb. 14, 1972, Ser. No. 226,350
Claims priority, application Germany, Aug. 8, 1964, T 26,759; Oct. 3, 1964, T 27,136; Nov. 14, 1964, T 27,418
Int. Cl. H01l 7/50
U.S. Cl. 156—3 6 Claims

ABSTRACT OF THE DISCLOSURE

A solid state circuit arrangement having a semiconductor member and presenting reduced shunt capacitances as the result of the isolation of various regions of the member from each other, and a method for fabricating such arrangement by forming a subassembly of two members, constituted by a first insulating layer and the semiconductor member, by depositing one of the members on the surface of the other thereof, depositing a second insulating layer on the side of the semiconductor member which is opposite from the surface upon which the first layer bears, forming apertures in at least one of the insulating layers to expose surface portions of the semiconductor member, and etching out the portions of the semiconductor member in the region of each aperture to create cavities which extend from one of the insulating layers to the other.

CROSS-REFERENCE TO RELATED APPLICATION

This application is a division of Application Ser. No. 476,536, filed August 2nd, 1965, now Pat. No. 3,689,992.

BACKGROUND OF THE INVENTION

The present invention relates to a method of producing solid-state circuits and particularly circuits with low shunt capacitances.

As is known, a solid-state circuit generally comprises a semiconductor body containing active and/or passive semiconductor components and having an insulating layer disposed thereon, with passive components and conducting paths being provided on the insulating layer. Various methods have already been suggested for preventing interactions between the components in the semiconductor body of the solid-state circuit and/or between them and a supporting body, and for eliminating capacitive shunts between the semiconductor body and both the passive components and the conducting paths, these methods being referred to as "separation" methods. A separation of the semiconductor components in the semiconductor body of a solid-state circuit may be achieved, for example, in such a manner that the semiconductor regions to be separated in the semiconductor body are surrounded with semiconductor material of the opposite conductivity type. This method has the disadvantage, however, that the PN junctions which result constitute relatively high capacitances and so the separated semiconductor regions have a high shunt capacitance. In order to prevent the formation of these shunt capacitances, a method is known whereby the surface of the semiconductor body, which is provided with raised portions, is provided with an insulating layer and a supporting layer of polycrystalline material, and then the semiconductor material is removed from the surface of the semiconductor body opposite the raised portions in such a manner that the semiconductor material connecting the raised portions is completely removed so that separated monocrystalline regions remain which are embedded in the insulating layer and supported by the supporting layer. That method has the great disadvantage, to be carried out with the utmost precision in order to to be carried out with the utmos precision in order to give the separated monocrystalline regions the thickness desired, and the coupling capacitance cannot be reduced below the value determined by the presence of the insulating layer.

The separation between the semiconductor elements and the passive components and conducting paths, which are on the insulating layer of the semiconductor arrangement, is likewise unsatisfactory because the insulating layers which are generally used have a thickness of about $1/\mu$ and less and therefore permit capacitive shunts to develop from the passive components and conducting paths to the semiconductor body. The shunt capacitances of the solid-state circuit have a particularly unfavorable effect on the frequency limits and the switching times of the components contained in the solid-state circuit; e.g. the limit frequency of transistors contained in the solid-state circuit is noticeably reduced.

SUMMARY OF THE INVENTION

It is, therefore, an object of the present invention to provide a method of producing a solid-state circuit arrangement with low shunt capacitance, by which method an effective separation between the components and conducting paths of the solid-state circuit is achieved and the mentioned disadvantages of the known methods are avoided.

According to the invention, these objects are generally achieved through the practice of a novel process where a subassembly of two members is formed by a first insulating layer and a semiconductor member, a second insulating layer is deposited on the side of the semiconductor member which is opposite from the side upon which the first layer is disposed, apertures are formed in at least one of the insulating layers so as to expose selected surface portions of the semiconductor member, and the member is etched out in the regions of the apertures so as to create cavities in the semiconductor member which extend from one of the insulating layers to the other.

According to a more specific form of the novel process, a semiconductor body is covered with alternating insulating layers and semiconductor layers and subsequently the semiconductor material between two insulating layers is removed in certain regions. As a result of the use of this process of the present invention, an effective separation is rendered possible both between the components and conducting paths of the solid-state circuit and between these elements and the semiconductor body the reason for this being that the separation is created by cavities etched out of the semiconductor material, i.e., by a medium having a relative permitivity of 1 (air). The insulating layers present in the interior of the arrangement act as boundaries to limit the downward extent of the selective etching process during the etching of the cavities in the semiconductor body, so that there is no risk of the entire arrangement being etched through. The consequence of this is that, according to the invention, it is possible to adjust the lateral extent of the cavities, or of the regions on an insulating layer which are undermined by etching, by controlling the etching time.

Additional objects and advantages of the present invention will become apparent upon consideration of the following description when taken in conjunction with the accompanying drawings in which:

DESCRIPTION OF THE PREFERRED EMBODIMENTS

With more particular reference to the drawings, one example of the method according to the invention will be explained with reference to FIGS. 1*a* and 1*b*. A semiconductor body 1, for example, a silicon semiconductor body, is provided on one side with an insulating layer 2, for example, by deposition of a layer of silicon oxide, and then with a supporting layer 3, for example, a layer of polycrystalline semiconductor material. The application of the supporting layer 3 is preferably effected by precipitation from the gaseous phase, for example, by reduction of silicon tetrachloride with hydrogen, or by vapor deposition, deposition by sintering or similar deposition methods. Then the portion 1' of the semiconductor body 1 is removed so that a residual layer thickness of, for example, about 10 to 50$\mu$ remains, as illustrated in cross-section in FIG. 1*a*.

Since the remaining semiconductor layer is disposed on an insulating base, it is in this case possible to determine the remaining layer thickness by means of a known four-point conductivity measuring arrangement, assuming the conductivity of the semiconductor material is known.

Figure 1:
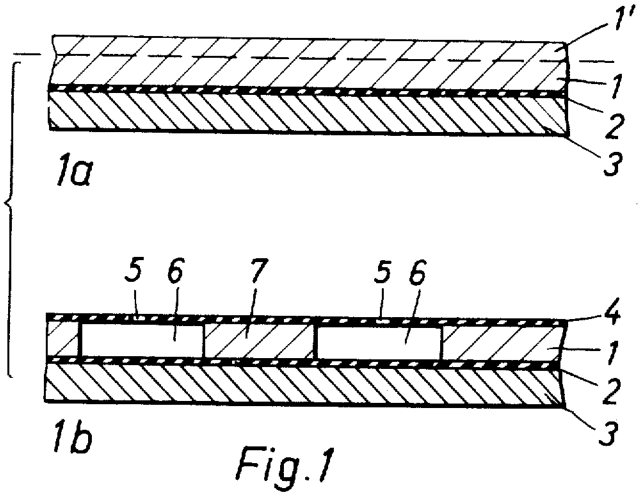
FIGS. 1*a* and *b* are longitudinal cross-sectional views of a portion of a unit in various stages of fabrication according to the process of the present invention.

After the removal of the required thickness of portion 1', the semiconductor body is coated with an insulating layer 4, as is indicated in FIG. 1*b*. Thereafter, the insulating layer 4 is pierced at points outside the regions containing the components and conducting paths to be separated, for example, at the points 5.

Through the apertures 5 in the insulating layer 4, cavities 6 are now produced by etching down to the depth of the insulating layer 2 embedded in the interior of the arrangement, by means of a selective etching medium which only attacks the semiconductor body and not the insulating layers. There exist many well-known commercially available mediums capable of producing this action. In this manner, the separated monocrystalline regions 7 of the semiconductor arrangement are formed. The insulating layer 2 limits the said selective etching process in the downward direction so that, according to the invention, it is possible to control the lateral extent of the cavities 6 in all directions parallel to the planes of layers 2 and 4 by controlling the etching time.

According to the invention, it is also possible to make the apertures 5 in the insulating layer 4 very small, so that a very efficient utilization of the surface area of the insulating layer 4 becomes possible with respect to the passive components and conducting paths provided thereon.

Finally, active and/or passive semiconductor components and conducting paths are produced in known manner on the portions of layer 4 above the cavities 6. According to the present invention, however, it is also possible to produce these components and conducting paths wholly or partially before the cavities 6 are produced in the semiconductor arrangement.

In the above example, the semiconductor material is removed from below the passive components and/or conducting paths provided on the upper insulating layer and from adjacent the separated monocrystalline semiconductor regions, but not from below the latter. If it is more desirable that a very low coupling capacity exist between the separated semiconductor regions than that these regions have a high heat dissipation, it is proposed, according to a further feature of the invention, to remove portions of the semiconductor material 3 from below the separated regions 7, starting from the bottom surface of the arrangement, by means of a selective etching process. The separated regions 7 are then supported only by the two insulating layers 2 and 4 and are otherwise exposed on all sides so as to produce the minimum possible coupling capacity. If a certain amount of heat dissipation is essential, then the apertures etched out below the separated regions are refilled from below with an insulating material having a low dielectric constant and satisfactory heat conduction.

Figure 2:
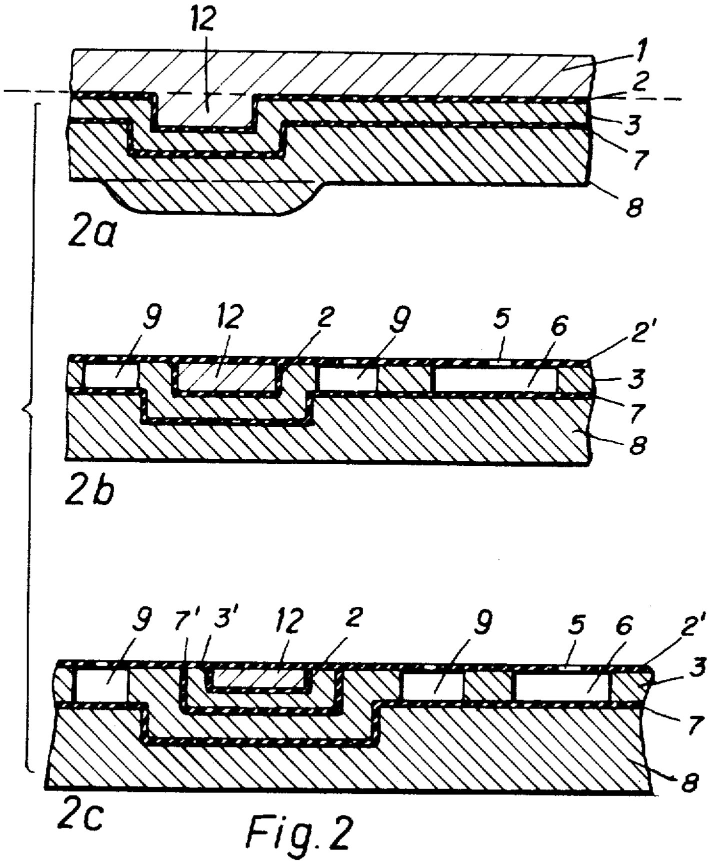
FIGS. 2*a* and *b* are views similar to those of FIGS. 1 showing various stages in the fabrication of another unit according to the methods of the present invention.
FIG. 2*c* is a similar view showing a modification of the unit of FIG. 2*b*.

Another example of the method of the present invention will be explained with reference to FIGS. 2*a*, 2*b* and 2*c*. Semiconductor material is first removed from the bottom of the body 1 in such a manner that forms a plurality of projecting monocrystalline regions 12 which are to be separated from one another. An insulating layer 2, a layer 3, for example, of polycrystalline semiconductor material, an insulating layer 7 and a further layer 8 of polycrystalline semiconductor material, whose exposed surface may subsequently be levelled, are then produced in succession and applied to the bottom of the body 1, as shown in FIG. 2*a*. Then the top of the semiconductor body 1 is removed down to the broken line in FIG. 2*a* and subsequently covered with a continuous insulating layer 2', as illustrated in FIG. 2*b*. Thereafter apertures 5 are produced in the insulating layer 2' and then, in accordance with the invention, cavities 6 are produced, by means of an etching process, in the semiconductor layer 3 below the regions provided on layer 2' for components and conducting paths. Simultaneously with this operation, annular regions 9 may be created by etching out a portion of the semiconductor layer 4 surrounding each monocrystalline region 12. As a result, the coupling capacitance in the direction of the supporting layer 8 is reduced to about half of what it was prior to the formation of cavities 6 and 9, the thickness of the insulating layers 2 and 7 being unchanged, because the two insulating layers 2 and 7, or their capacitances, are now connected in series. Finally, semiconductor components are again produced in a known manner in the separated monocrystalline regions 12, and passive components and conducting paths are formed on the insulating layer 2'. According to the present invention, it is also possible to produce the components and conducting paths on the semiconductor arrangement wholly or partially even before the production of the cavities 6 and 9.

It should also be noted that according to the principles of the present invention, it is also possible to remove the semiconductor material from the portions of layer 3 extending below the monocrystalline regions 12 in the same manner as that used for removing such material from below the elements on the insulating layer 2', and so to considerably reduce the coupling capacitance between regions 12, although this involves a reduction in heat dissipation capabilities of these insulated semiconductor regions.

FIG. 2*c* shows a further example of a unit produced according to the principles of the present invention. The procedure is similar to that described in connection with FIG. 2*a*, but before the deposition of the semiconductor layer 3, the semiconductor layer 3' is deposited and the insulating layer 7' produced thereupon. Then again the semiconductor layer 3 is produced on the insulating layer 7', followed by the insulating layer 7, and then the semiconductor layer 8. In the arrangement thus formed, material is now removed from the monocrystalline side in such a manner that only the monocrystalline island 12 is left, surrounded by the insulating layers 2 and 7' which meet the surface substantially perpendicularly, and by the semiconductor layer 3' which is between layers 2 and 7' and which likewise meets the surface perpendicularly. Then the insulating layer 2' is applied and the procedure is continued as described in the explanation of FIG. 2*b* so that finally the unit shown in FIG. 2*c* is obtained. According to the invention, it is also possible for the cavity 9 to extend as far as the insulating layer 7'.

Mention may be made of the fact that, according to the invention, it is also possible to produce further insulating layers which cause a further reduction in shunt capacitance.

Figure 3:
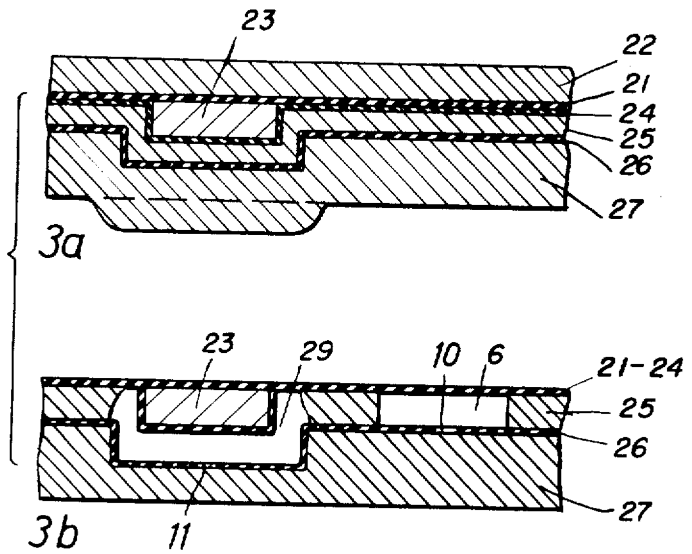
FIGS. 3*a* and *b* are views, similar to those of FIGS. 1, of yet another unit produced according to the present invention.

A further example of the method according to the invention is illustrated in FIGS. 3*a* and 3*b*. A semiconductor body having a polished upper surface is provided, at its upper surface, with an insulating layer 21 and an auxiliary supporting layer 22, for example, of polycrystalline semiconductor material, and material is then removed from the under side of the semiconductor body in such a manner that only monocrystalline regions 23 remain. Then the under side of the semiconductor body is covered with an insulating layer 24, a layer 25 of polycrystalline semiconductor material, an insulating layer 26, and a supporting layer 27 of polycrystalline semiconductor material, which, if desired, may be levelled off as suggested in FIG. 3*a*. Then the auxiliary supporting layer 22 at the top is entirely removed, for example, by means of a selective etching agent. Now apertures are produced in the insulating layer 21–24, in the same manner as previously described and, through these perforations in the insulating layer, cavities are produced in the semiconductor layer 25 below the passive components and conducting paths which have been provided, or are to be provided, on the insulating layer 21–24 and/or a cavity may be produced around each monocrystalline semiconductor region 23.

In a further development of the invention, it is proposed to produce the cavities 6 and 29 by an etching out of the semiconductor layer 25 from below through apertures 10 and 11 in the insulating layer 26, after the application of the insulating layer 24, the semiconductor layer 25, and the insulating layer 26, as shown in FIG. 3*b*. Only after perforations 10 and 11 have been made, and cavities 6 and 29 formed, is the supporting layer 27 applied. In order to increase the stability of the monocrystalline regions, it is possible, in accordance with a non-illustrated variation of the above process, to remove only the portions of semiconductor material 25 directly below the region 23, so that the region 23 is still at least partially surrounded with supporting semiconductor material adjacent the narrow edge of region 23 which extends substantially perpendicular to surface 21. This construction causes only a slight increase in capacitance which can generally be accepted, but it does lead to an increase in mechanical stability and strength in comparison with the embodiment shown in FIG. 3*b*. Returning to FIG. 3*b*, it should be noted that the invention as described has the advantage that apertures in the insulating layer 21–24 are avoided, that is to say, an uninterrupted insulating layer is available at the surface of the semiconductor body for the placing of components and conducting paths. According to the invention, moreover, it is possible to bring the cavities 6 and 29 into communication with the surrounding atmosphere while they are being produced by means of tiny apertures at the top or bottom of the arrangement which serve to prevent the insulating layers which have been exposed by etching, from bursting when subjected to high thermal loading.

According to the invention, it is also possible, in all cases, to use as a starting material a semiconductor body having selected sections given any desired doping by, for example, diffusion or epitaxial processes. In addition, it is possible, according to the invention, to produce a low-resistance layer on the appropriate surface of the semiconductor body by diffusion or epitaxial methods in order to reduce the collector path resistance, this being done before the application of the insulating layer 2 in the first example (FIG. 1*a*), before the application of the insulating layer 2 in the second example (FIG. 2*a*), and before the application of the insulating layer 24 in the third example (FIG. 3*a*).

Figure 4:
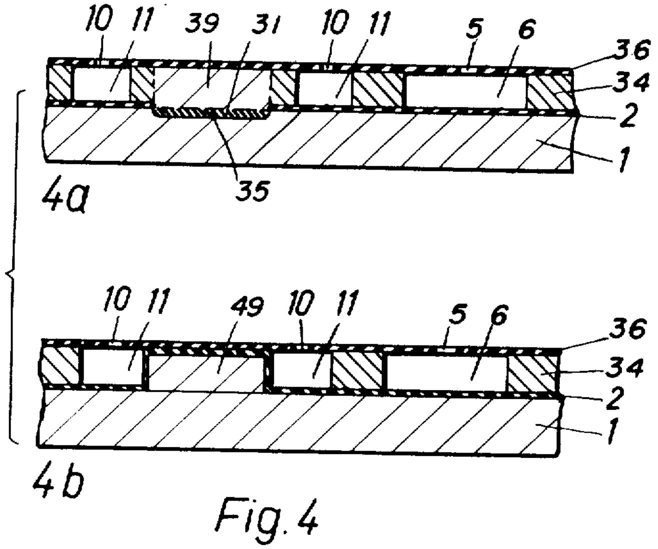
FIG. 4*a* is a view similar to that of FIG. 3*b* showing still another unit fabricated according to the present invention.
FIG. 4*b* is a view similar to that of FIG. 3*b* showing a modified form of the unit of FIG. 4*a*.

Another example of the method according to the invention is illustrated in FIG. 4*a*. A semiconductor body 1 is covered with an insulating layer 2 which is then pierced in the region 31 through the application of masking techniques. Then a semiconductor layer 34, of the opposite type of conductivity from the semiconductor body, for example n-type, is deposited in an epitaxial reactor on the surface of the semiconductor body, which has, for example, p-type conductivity, and layer 34 grows epitaxially in the region 31 and in a polycrystalline manner on the insulating layer 2. It is also possible—as is usual in separation with epitaxially grown PN junctions—to diffuse an $n^+$-zone 35 into the semiconductor body 1 in the region 31 before the growth process so as to obtain in this manner, for example, a low-resistance collector region. The grown semiconductor layer 34 is then covered with a continuous insulating layer 36. Apertures 5 are now provided in the insulating layer 36, and through these apertures the cavities 6 are selectively etched out of the semiconductor layer 34 below the components and conducting paths which have been vacuum deposited or are to be vacuum deposited on layer 36. According to the invention, this deposition of elements on layer 36 can be carried out either before or after the production of the cavities in the monocrystalline semiconductor regions 39. The lateral isolation of each monocrystalline region 39 may be effected, for example, by producing an annular aperture 10 in the insulating layer 36 and by etching out from the semiconductor layer 34 a cavity 11 which, for example, may also be annular. The portions of layer 36 remaining after the formation of apertures, or perforations, serve for the vacuum deposition of conducting paths on said insulating layer. The method according to the invention has the particular advantage that the separating PN junction, in FIG. 4*a* the PN junction on the bottom of zone 35, is bounded by the opening 31 in the insulating layer 2 and so is automatically passivated. This passivated separation junction will be isolated from the cavity 11 if the latter is not made too large.

Turning now to FIG. 4*b*, there is shown a modification of the unit of FIG. 4*a*. The semiconductor body 1 consists of a substrate having an opposite conductivity-type epitaxial layer thereon. The epitaxial layer is removed from the body 1, by means of the photo-masking technique, for example, in such a manner that the required monocrystalline epitaxial regions 49 are left. There after, an insulating layer 2 and a polycrystalline semiconductor or layer 34 are applied. Then the surface of the semiconductor arrangement is levelled off and covered with a continuous insulating layer 36. The etching out of the cavities 6 and 11 according to the invention is effected as in the above example. This method has the advantage that even in the event of an etching process which lasts too long during the production of the cavities 11, the PN junction in the region 49 is not attacked or exposed.

Figure 5:
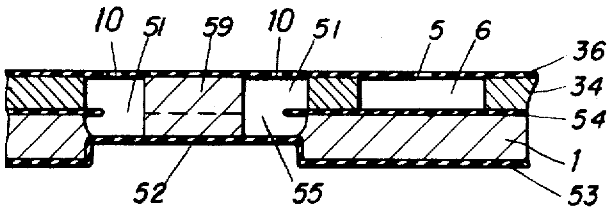
FIG. 5 is a similar view showing another product of the process of the present invention.

FIG. 5 shows a further example of the method according to the invention. Recesses 52 are etched into the under side of the semiconductor body 1 below the locations where semiconductor regions 59 are to be grown, the recesses being somewhat larger than the desired monocrystalline semiconductor regions 59. Then the surface of the semiconductor body is covered on both sides with an insulating layer, for example, by means of thermal oxidation, whereby the lower insulating layer 53 and the upper insulating layer 54 are formed. Apertures 55 are now formed in the insulating layer 54 so as to be smaller than the area of the recesses 52, to which they are parallel, and larger than the required semiconductor regions 59. Then the semiconductor layer 34 is deposited in an epitaxial reactor and grows on the semiconductor arrangement epitaxially over the apertures 55 and in the polycrystalline manner over the insulating layer 54. Then an insulating layer 36 is produced on the surface of the arrangement. Now apertures 5 and 10 are produced in the insulating layer 36 and, through these apertures, the cavities 6 and 51 are selectively etched out of the semiconductor material below the components and conducting paths which are present on, or to be applied to, the insulating layer 36, the etching being carried out in such a manner that the cavities 51 reach as far as the insulating layer 53, as a result of which the monocrystalline semiconductor regions 59 are free of contact with semiconductor material on all sides. In the semiconductor arrangement produced by means of the above method, the assembly of each separated monocrystalline region and its associated portion of body 1 has the minimum possible coupling capacitance because apart from their contact with layers 36 and 53, these assemblies are surrounded on all sides by air, that is to say, by a medium having a permittivity of 1.

Figure 6:
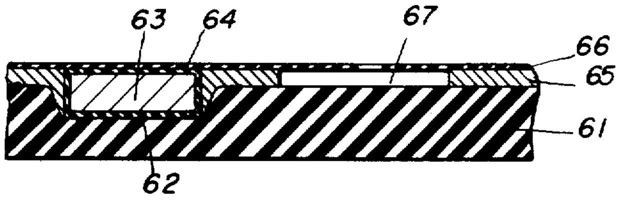
FIG. 6 is a similar view showing yet another product of the present invention.

An example of a further development of the method according to the invention is illustrated in FIG. 6. A supporting wafer 61, which is preferably an insulator made of ceramic material, for example, is provided on its surface with recesses 62 by chemical means, or mechanically by sandblasting or ultrasonics, or thermally by means of electron of laser beams, to cite only a few possible techniques for producing such recesses. Monocrystalline semiconductor bodies 63, which are covered with an insulating layer 64, are inserted in the recesses 62 so as to at least partially fill said recesses. Then the supporting wafer 61 and the inserted semiconductor body 63 are provided with a semiconductor covering layer having a thickness of 20 to 100$\mu$, for example, which is then levelled off preferably to the height of the assembly of semiconductor body 63 and layer 64, for example, by a grinding process, and is then covered with an insulating layer, preferably by means of thermal oxidation. As a result, a semiconductor layer 65 remains below the insulating layer 66. Portions of layer 65 are removed by etching below the components and conducting paths which have been vacuum deposited, or are to be vacuum deposited, on the insulating layer 66, so that the cavities 67 are formed between the supporting wafer 61 and insulating layer 66.

Figure 7:
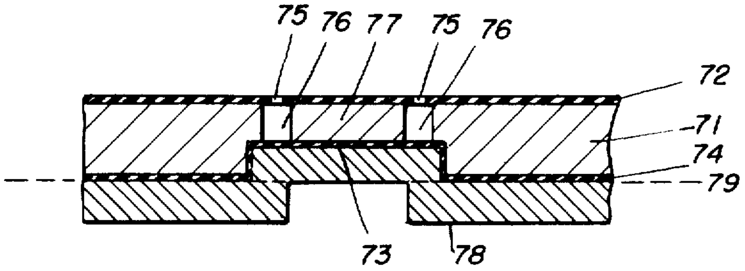
FIG. 7 is a similar view showing a further product of the invention.

Another possibility of the method according to the invention is illustrated in FIG. 7. A semiconductor body 71 is provided with an insulating layer 72, then recesses 73 are etched therein to such a depth that the thickness of the semiconductor material remaining above each of them corresponds substantially to the thickness of monocrystalline regions to be produced. Then the surface of the arrangement provided with the recesses is coated with a further insulating layer 74. According to the invention, however, it is possible to provide the semiconductor body 71 first with recesses 73 and then to cover it with an insulating layer on all sides. Now the insulating layer 72 is partially pierced, for example, by selective etching at a plurality point 5 around the circumference of each required monocrystalline region, and, through these apertures, an annular groove 76 is, for example, selectively etched out of the semiconductor body down to the opposite insulating layer 74, so that isolated monocrystalline regions 77 are left between the insulating layers 72 and 74. According to the invention, however, it is also possible to pierce the insulating layer 74 wholly or partially along the circumference of each required monocrystalline region, and to etch the grooves 76 out of the semiconductor body through these apertures as far as the insulating layer 72. The recesses 73 are completely or partially filled with semiconductor material 78, for example, by vapor deposition or growth. According to the invention, however, it is also possible to use insulating material for the layers 78. In this latter case it would no longer be necessary to apply the insulating layer 74 to the arrangement.

According to the invention, it is also possible to omit the layer 78 completely in the example shown in FIG. 7 in order to render the resulting device more suitable for low power circuits.

If it is necessary to provide solder connections, that is to say, to make contact to the semiconductor body 71, the protruding semiconductor and insulating material 78 and 74 is removed along the dividing line 79 by means of a grinding process so that the semiconductor arrangement then has a planar back.

Figure 8:
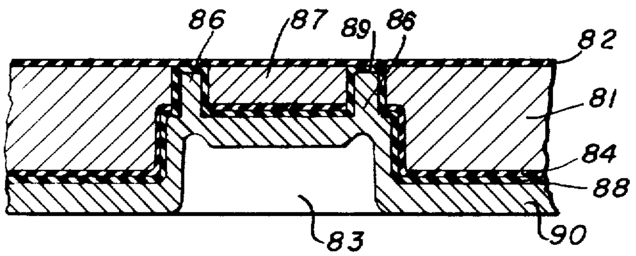
FIG. 8 is a similar view showing yet a further product of this invention.

Another form of unit which can be produced according to the present invention is shown in FIG. 8 to comprise a semiconductor body 81 on one side of which is disposed an insulating layer 82. A plurality of recesses 83 are formed in the other side of body 81 in such a way as to extend only partially into said body, and an insulating layer 84 is then deposited on this latter side of body 81. Now, an annular aperture or a series of circumferentially spaced apertures, is formed in the portion of layer 84 extending into each recess 83 and the aperture, or apertures, is used as the passage through which an annular groove 86 is etched in body 81, by means of a selective etching agent, for example, this groove being made to extend down to layer 82. Each groove 86 thus serves to create an isolated monocrystalline semiconductor region 87. Another insulating layer 88 is then disposed on the recessed side of body 81 so as to cover the exposed surfaces of groove 86. Portions 89 of layer 88 also serve to reinforce layer 82 in the regions where it extends across each groove 86. Since the resulting regions 87 are only supported by, and hence are only in contact with, layers 82 and 88, they have an extremely low shunt capacitance.

If it were desired to increase the heat dissipation capabilities of elements formed in regions 87, one could, according to the principles of the present invention, deposit a support layer 90 on insulating layer 88 in such a way as to completely fill grooves 86 and recesses 83 and to completely cover layer 88. Layer 90 may, for example, be made of polycrystalline semiconductor material.

It will be understood that the above description of the present invention is susceptible to various modifications, changes, and adaptations, and the same are intended to be comprehended within the meaning and range of equivalents of the appended claims.

What is claimed is:

1. A method for fabricating a solid state circuit arrangement having a plurality of semiconductor regions isolated from each other, comprising the steps of:

(a) forming a subassembly of at least two members, constituted by a first insulating layer and a semiconductor member, by depositing one of said members on one surface of the other thereof;

(b) forming individual circuit components in the semiconductor member;

(c) depositing a second insulating layer on the side of said semiconductor member which is opposite from the surface thereof upon which said first layer bears;

(d) forming apertures in said second insulating layer in the area between said circuit components so as to expose surface portions of said semiconductor member;

(e) etching out the portions of said semiconductor member in the regions of said apertures so as to create cavities in said semiconductor member which extend from one of said insulating layers to the other thereby electrically isolating said circuit components from one another by the space remaining after said etching and said first insulating layer; and (f) applying a further supporting layer to the side of the resulting unit on which said second insulating layer is disposed after said etching-out process has been performed such that said supporting layer extends over said apertures while said cavities remain free of material.

2. A method for fabricating a solid state circuit arrangement having a plurality of semiconductor regions isolated from each other, comprising the steps of:

(a) forming a subassembly of at least two members, constituted by a first insulating layer and a semiconductor member, by performing the operations of:
(1) providing a semiconductor body;
(2) coating one side of said body with said first insulating layer;
(3) forming apertures in selected regions of said first insulating layer;
(4) producing low resistance regions in said semiconductor body by the diffusion of foreign atoms on the portions of said one side of said body exposed by said apertures;
(5) depositing said semiconductor member in the form of a semiconductor layer by growing said layer, in an epitaxial reactor, on the surface defined by said first insulating layer and said low resistance regions; and
(6) forming individual circuit components on the surface of said semiconductor member opposite said low resistance regions;

(b) depositing a second insulating layer on the side of said semiconductor member which is opposite from the surface thereof upon which said first layer bears;

(c) forming apertures in at least one of said insulating layers so as to expose surface portions of said semiconductor member; and (d) etching out the portions of said semiconductor member in the regions of said apertures so as to create cavities in said semiconductor member which extend from one of said insulating layers to the other thereby electrically isolating said circuit components from one another by the space remaining after said etching and said first insulating layer.

3. A method for fabricating a solid state circuit arrangement having a plurality of semiconductor regions isolated from each other, comprising the steps of:

(a) forming a subassembly of at least two members, constituted by a first insulating layer and a semiconductor member by performing the operations of:
(1) providing a semiconductor body carrying an epitaxial layer of the opposite conductivity type;
(2) removing spaced portions of said epitaxial layer so as to leave isolated monocrystalline regions on said body;
(3) forming individual circuit components in said monocrystalline regions;
(4) applying said first insulating layer to the side of said body from which said regions extend;
(5) depositing said semiconductor member in the form of a semiconductor layer on said first insulating layer; and
(6) removing a portion of said semiconductor member so as to leave only those parts thereof which extend between said isolated monocrystalline regions;

(b) depositing a second insulating layer on the side of said semiconductor member which is opposite from the surface thereof upon which said first layer bears;

(c) forming apertures in at least one of said insulating layers so as to expose surface portions of said semiconductor member; and (d) etching out the portions of said semiconductor member in the regions of said apertures so as to create cavities in said semiconductor member which extend from one of said insulating layers to the other thereby electrically isolating said circuit components from one another by the space remaining after said etching and said insulating layers.

4. A method for fabricating a solid state circuit arrangement having a plurality of semiconductor regions isolated from each other, comprising the steps of:

(a) forming a subassembly of at least two members, constituted by a first insulating layer and a semiconductor member, by performing the operations of:
(1) providing a semiconductor body having recesses in one side which are larger than the semiconductor regions to be isolated;
(2) coating said one side of said semiconductor body with a preliminary insulating layer;
(3) coating the side of said semiconductor body which is opposite from said one side with said first insulating layer;
(4) forming an opening in said first insulating layer opposite each of said recesses, which opening is smaller than its respective recess but larger than the isolated semiconductor region to be formed at that location;
(5) applying said semiconductor member in the form of a semiconductor layer by depositing a layer of semiconductor material in an epitaxial reactor upon said first insulating layer and upon the portions of said semiconductor body which are exposed by said openings; and
(6) forming individual circuit components in the portions of said semiconductor member deposited upon said portions of said semiconductor body;

(b) depositing a second insulating layer on the side of said semiconductor member which is opposite from the surface thereof upon which said first layer bears;

(c) forming apertures in at least one of said insulating layers so as to expose surface portions of said semiconductor member; and (d) etching out the portions of said semiconductor member in the regions of said apertures so as to create cavities in said semiconductor member which extend from one of said insulating layers to the other thereby electrically isolating said circuit components from one another by the space remaining after said etching and said insulating layers.

5. A method for fabricating a solid state circuit arrangement having a plurality of semiconductor regions isolated from each other, comprising the steps of:

(a) forming a subassembly of at least two members, constituted by a first insulating layer and a semiconductor member, by performing the operations of:
(1) providing, as said first insulating layer, an insulating support wafer having recesses in one of its surfaces;
(2) placing a monocrystalline semiconductor body which is coated with a preliminary insulating layer in each of said recesses;
(3) applying said semiconductor member in the form of a semiconductor covering layer on said insulating wafer so that the upper surface of said covering layer is level with the upper surface of said semiconductor bodies; and
(4) forming individual circuit components in said monocrystalline semiconductor bodies;

(b) depositing a second insulating layer on the side of said semiconductor member which is opposite from the surface thereof upon which said first layer bears;

(c) forming apertures in at least one of said insulating layers so as to expose surface portions of said semiconductor member; and (d) etching out the portions of said semiconductor member in the regions of said apertures so as to create cavities in said semiconductor member which extend from one of said insulating layers to the other thereby electrically isolating said circuit components from one another by the space remaining after said etching and said insulating layers.

6. A method for fabricating a solid state circuit arrangement having a plurality of semiconductor regions isolated from each other, comprising the steps of:

(a) forming a subassembly of at least two members, constituted by a first insulating layer and a semiconductor member, by: providing said semiconductor member in the form of a semiconductor body; depositing a first insulating layer on one side of said semiconductor member; forming recesses in the opposite side of said semiconductor member from said first insulating layer, said recesses extending partially into said semiconductor body down to a predetermined depth; and forming individual circuit components in said recessed portions of said semiconductor body;

(b) depositing a second insulating layer on the side of said semiconductor member which is opposite from the surface thereof upon which said first layer bears;

(c) forming apertures in said second insulating layers in the region where said second layer extends into said recesses so as to expose surface portions of said semiconductor member; and (d) etching out the portions of said semiconductor member in the regions of said apertures so as to form a continuous groove in the semiconductor material beneath each said recess, which groove extends completely to the surface of said first insulating layer so as to isolate said circuit components from one another.

References Cited

UNITED STATES PATENTS

| | | | |
|---|---|---|---|
| 3,158,788 | 11/1964 | Last | 317—101 |
| 3,320,485 | 5/1967 | Buie | 317—101 |

WILLIAM A. POWELL, Primary Examiner

U.S. Cl. X.R.

156—8, 11, 17